(12) United States Patent
Meyer et al.

(10) Patent No.: US 7,601,278 B2
(45) Date of Patent: Oct. 13, 2009

(54) PRECURSOR SOLUTION, METHOD OF PREPARATION THEREOF AND USE THEREOF

(75) Inventors: Joerg Meyer, Aachen (DE); Mareike Katharine Klee, Hueckelhoven (DE); Rainer Kiewitt, Roetgen (DE)

(73) Assignee: NXP B.V., Eindhoven (NL)

( * ) Notice: Subject to any disclaimer, the term of this patent is extended or adjusted under 35 U.S.C. 154(b) by 606 days.

(21) Appl. No.: 10/562,537

(22) PCT Filed: Jul. 1, 2004

(86) PCT No.: PCT/IB2004/051085

§ 371 (c)(1),
(2), (4) Date: Apr. 28, 2006

(87) PCT Pub. No.: WO2005/004222

PCT Pub. Date: Jan. 13, 2005

(65) Prior Publication Data

US 2006/0231014 A1    Oct. 19, 2006

(30) Foreign Application Priority Data

Jul. 4, 2003    (EP) .................................. 03102022

(51) Int. Cl.
*H01B 1/00* (2006.01)
*H01B 1/02* (2006.01)
*C01B 13/14* (2006.01)

(52) U.S. Cl. .................. 252/500; 252/518.1; 252/519.2; 252/519.21; 423/592.1

(58) Field of Classification Search .................. 252/500, 252/518.1, 519.2, 519.21; 423/592.1
See application file for complete search history.

(56) References Cited

U.S. PATENT DOCUMENTS

| | | | | |
|---|---|---|---|---|
| 5,545,394 A | * | 8/1996 | Doxsee | 423/659 |
| 5,858,323 A | * | 1/1999 | Boyle | 423/594.8 |
| 5,894,064 A | * | 4/1999 | Hampden-Smith et al. | 438/3 |
| 5,911,944 A | * | 6/1999 | Kitaoka | 264/622 |
| 5,995,359 A | * | 11/1999 | Klee et al. | 361/305 |
| 6,066,581 A | | 5/2000 | Chivukula et al. | |
| 6,104,597 A | * | 8/2000 | Konushi et al. | 361/301.4 |
| 6,110,441 A | * | 8/2000 | Kitaoka | 423/593.1 |
| 6,136,229 A | * | 10/2000 | Cui et al. | 252/518.1 |
| 6,432,238 B1 | * | 8/2002 | Yun et al. | 156/89.12 |

(Continued)

FOREIGN PATENT DOCUMENTS

EP    0676384 A2    10/1995

(Continued)

OTHER PUBLICATIONS

Yoon et al., "Characteristics of Lead Magnesium Niobate Thin Film Prepared by Sol-Processing Using a Complexing Agent," J. Am. Ceram. Soc., 78(8), pp. 2267-2270 (1995).*

(Continued)

*Primary Examiner*—Mark Kopec
*Assistant Examiner*—Jaison P Thomas

(57) ABSTRACT

Crystalline, single-phased layers of $PbMg_{0.33}Nb_{0.67}O_3$ with relative dielectric constants of 1500 and more are prepared through the use of a precursor solution that comprises a macrocyclic complexing agent. This agent is added to the lead component in an organic solution. The resulting layer is part of a device which may further include semiconductor elements and resistors.

18 Claims, 2 Drawing Sheets

Figure 1:
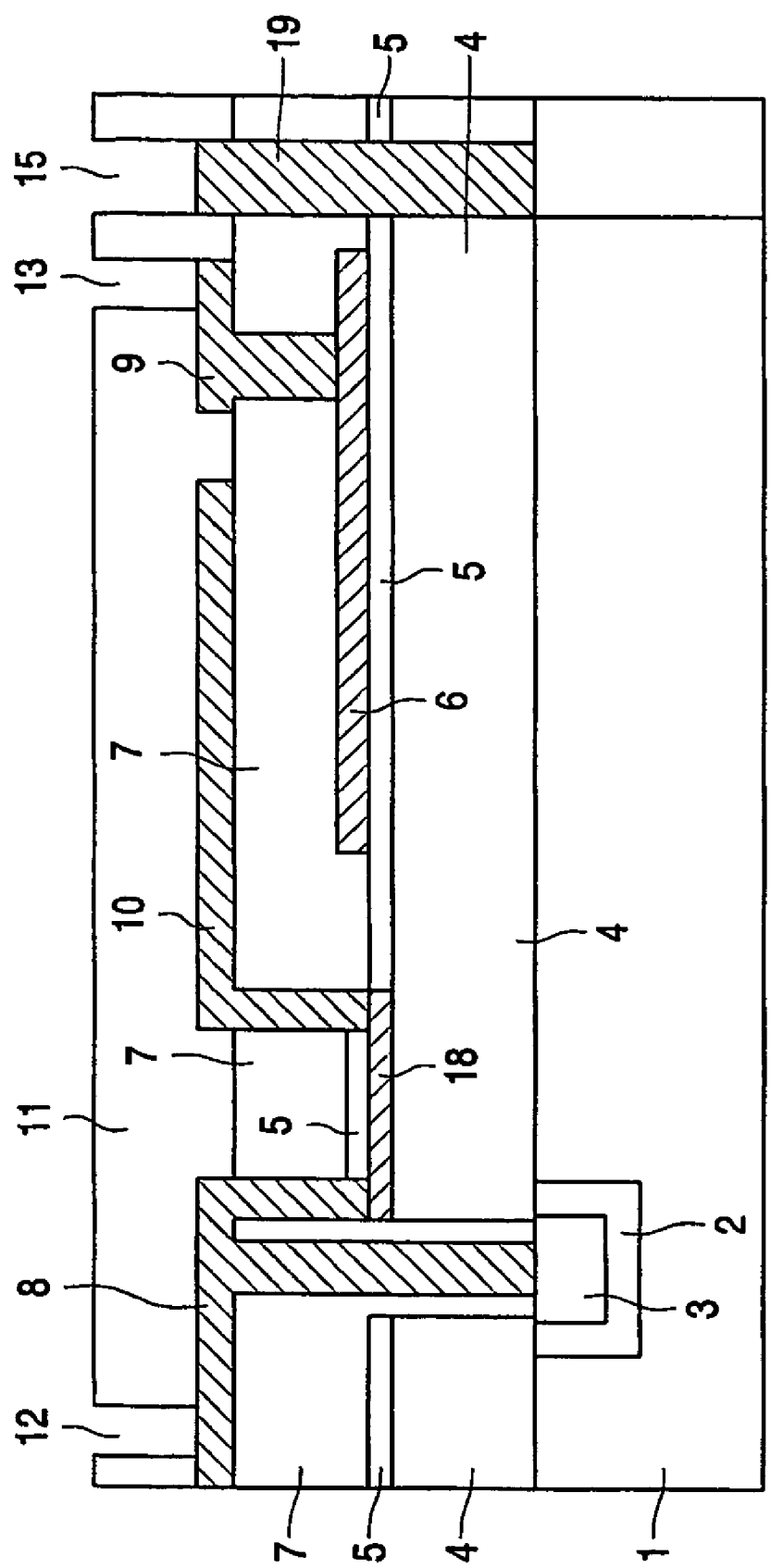

U.S. PATENT DOCUMENTS 7,350,904 B2 * 4/2008 Noguchi et al. .............. 347/72
2006/0160373 A1 * 7/2006 Kowalski et al. ............ 438/778

FOREIGN PATENT DOCUMENTS

JP        H11-060337    *   2/1999
WO     WO 03/014134    *   2/2003

OTHER PUBLICATIONS

Lee, W.S. et al., "Synthesis of perovskite Pb(Zn1/3Nb2/3)O3 powders via a polymer complex solution route with a large excess of polyethylene glycol," Advanced Powder Technol., 13(1), pp. 43-54 (2002).*

Camargo et al., Pyrochlore-free Pb(Mg1/3Nb2/3)O3 prepared by a combination of the partial oxalate and polymerized complex methods, 314, pp. 140-146 (2001).*

* cited by examiner

PRECURSOR SOLUTION, METHOD OF PREPARATION THEREOF AND USE THEREOF

The invention relates to a precursor solution for a crystalline layer containing an oxide of lead, niobium and a third metal.

The invention also relates to a method of preparing such a precursor solution.

The invention further relates to a method of manufacturing an electronic device comprising the step of applying said precursor solution onto a substrate, and crystallizing it to the lead-magnesium niobate layer, and to an electronic device obtainable therewith.

Such a precursor solution and such methods are known from U.S. Pat. No. 6,066,581. Example 7 hereof discloses a precursor solution of the sol-gel type, in which precursor compounds of several metals, including lead, magnesium and niobium, are present. The precursor solution was prepared by mixing solutions of lead nitrate in de-ionized distilled water, magnesium nitrate in de-ionized water and methoxy-ethanol, and niobium ethoxide in methoxy-ethanol and acetylacetone. The sol gel type precursor solution is applied on a substrate and subsequently transformed into the perovskite layer by firing the film at 350 to 400° C. Hereafter, a rapid annealing treatment is given, preferably in an oxygen-containing, in the form of a 100° C./sec ramp to 600-800° C. to crystallize. The resulting crystalline layer is primarily of the perovskite structure, although undesirable lead niobate pyrochlore structures are formed. Use is made of organic anions such as propoxide and isopropoxide for niobium and magnesium, whereas the lead is provided as an inorganic salt, e.g. lead nitrate, or lead perchlorate the films into the required crystallographic phase.

It is a disadvantage of the known method that the formation of the pyrochlore structure cannot be suppressed, leading to the fact that the crystalline layer has a lower dielectric constant than is desired.

It is therefore a first object of the invention to provide a method of manufacturing an electronic device of the kind mentioned in the opening paragraph with a crystalline layer of the perovskite phase.

It is therefore a second object of the invention to provide a precursor solution of the kind mentioned in the opening paragraph, that can be crystallized into the perovskite phase without the formation of undesirable pyrochlore side phases.

It is a third object of the invention to provide a method of preparing the precursor solution of the kind mentioned in the opening paragraph leading to the improved solution.

The third object is achieved in that it comprises the steps of:
providing a first solution of a lead salt that is chelated with a macrocyclic compound in a solvent chosen from the group of alkoxyalcohols;
providing a second solution comprising niobium complexed in the form of alcoholates and/or β-diketonates; and
mixing the first and the second solution.

The second object is achieved in a solution obtainable with the method of the invention. The first object is achieved in that the precursor solution of the invention is used.

According to the invention, the first lead-containing solution comprises a macrocyclic compound having a cavity corresponding to the size of the lead-ion as a chelator and an alcoholic or alkoxy-alcoholic solvent. The precursor solution comprising this first solution shows advantageous properties after application as a layer onto the substrate. It has been found that it crystallizes into the desired perovskite phase without any substantial amount of the undesirable pyrochloric crystalline phase. This pyrochloric phase is in fact an oxide of lead and niobium only. Due to the macrocyclic compound used as a chelator, the precursor solution turns out to be stable, and is gelated as desired. The stability of the gelated precursor solution, in which the different metal compounds have been preformed into a network, assures that the resulting layer can be crystallinized easily.

From U.S. Pat. No. 5,894,064 such a method of preparing a precursor solution is known, in which the first solution comprises a complex of barium acetate and an 18-crown-6 in water. This crown-ether is used for the object of preventing oligomerization of the precursor in solution, and therewith preventing the formation of $BaCO_3$. Such oligomerization means that the Ba-ions are coupled through acetate-bridges. Such mechanism is not active in the present invention. The alkoxyalcoholic solvent stabilizes the coordination of the lead ions and therewith prevents such oligomerization. There is no sign or suggestion that the crown-ether could prevent the formation of any undesired pyrochloric phase. These pyrochloric phases are particularly problematic for lead-containing perovskites. The main pyrochloric phase has the composition of $Pb_3Nb_4O_{13}$, but there are several others including some which contain also the third elements. The pyrochloric phases have in common that they contain less lead. In addition to the pure pyrochloric phases, any mixture crystals of the pyrochloric phase and the perowskite phase are formed in the prior art method, but not in the method of the invention.

The third metal is particularly an earth alkali metal, such as Strontium, Calcium, Magnesium, Barium but can alternatively be Iron. Particularly preferred is the choice of magnesium, leading to a perovskite layer of $PbMg_{0.33}Nb_{0.67}O_3$. Such layers have high dielectric constant in comparison to other perovskite layers. Most preferred is a solid solution comprising both $PbMg_{0.33}Nb_{0.67}O_3$ and a further perovskite, such as lead titanate, lead zirconate or lead zirconium titanate. The method of the invention is particuraly suitable, for these layers in that the crystallization temperature can be relatively low, in the order of 550 to 700° C. Many prior art methods, such as those known from EP-A 676384, use a crystallization temperature of 800° C. If a lower temperature is used therein, the material will not crystallize into a perovskite phase only.

The combination of the low crystallization temperature and the crystallization into a perovskite phase only is particularly advantageous for integration of this layer into a multilayer thin film structure, particularly a structure that also includes active elements, such as diodes and/or transistors in the substrate, as well as resistors. The low temperature is beneficial to prevent formation of second phases and for process compatibility with other components in the device.

The alkoxyalcoholic solvent is preferably an aromatic and/or aliphatic alcohol with one or more hydroxyl functions, and furthermore the ethers thereof have short-chained alkanols. The alcohols can be partly or completely etherized. Carboxylic acids and non-functionalized aromatic compounds may be used alternatively. Most preferred are bifunctional, singly etherized (e.g. methoxy-, propoxy-, butoxy-) short-chained alcohols, such as 1-methoxy-2-ethanol, 1-methoxy-2-propanol, 1-ethoxy-2-ethanol. Particularly preferred is the solvent 1-methoxy-2-propanol, which has the advantage of being non-toxic. It is preferred that the solvent of the second solution is identical to that of the first solution However, this is not necessary.

Preferably, the lead-salt comprising as anion a compound which forms an ester together with the alcoholate of the niobium-compound. The ratio between the equivalent number of the carboxylic acid anions and the alkanoates is in the range from 0.75 to 1.33. The alcoholates and carboxylates which are present in more or less stoichiometric ratio, can react with each other during the heating step, which usually precedes the crystallization step. The resulting ester is a volatile compound that will vaporize on heating. This results in a lower content of organics that must be removed during the crystallization treatment, which is generally done at higher temperatures. Suitable anions include carboxylates and nitrates.

A preferred example of a macrocyclic compound is the 18-Crown-6. The 15-Crown-5 does not lead to a good solubility of the lead salt in the alcoholic solvents. Other suitable compounds include spherands and calixarenes that have a cavity of size corresponding to the lead ion. Other macrocyclic compounds with a suitable cavity size are for instance dicyclohexyl-18-crown-6; 4,10-diaza-15-crown-5; 4,10-diaza-18-crown-6; and the cryptands [211], [221] and [222]. Complexes of these macrocyclic compounds with a $Pb^{2+}$-ion are described in a publication of H.-J. Buschmann and E. Schollmeyer, *J. Coord. Chem* 55(3) (2002), 287-291. There is no reason to exclude other macrocyclic compound with a suitable cavity size, and hence, a equally large or larger complexation constant.

The precursor solution may contain any further additives to control the viscosity, such as foramide or polyethylene glycol. It may further contain any other complexing agents in order to stabilize specific metal ions.

A preferred additive for the first solution is demineralized water. If less than 1 equivalent of crown ether is used per equivalent of lead-compound, the addition of water leads to dissolution of any precipitates formed.

In a preferred embodiment of the method of manufacturing the electronic device, the layer is applied onto a seed layer. The use of a seed layer results in a denser material with a higher dielectric constant. It furthermore increases the yield of thin film capacitors. A seed layer in a thickness of 10-100 nm works fine. A preferable thickness is 30 to 60 nm. Particularly preferred is a seed layer of lead zirconate titanate.

In a further embodiment, the substrate surface onto which the precursor solution is applied, is provided with a first electrode; the said layer is structured according to a desired pattern and on top of the said layer a second electrode is provided. In this manner, the crystalline layer is used as a thin-film capacitor. The structuring can be realized with wet-chemical etching, for instance with a mixture of $HNO_3$, HCl, acetic acid and HF followed by a post-treatment of diluted $HNO_3$. It is preferable to structure the layer in order to be able to provide it as a thin-film structure on a substrate, in and on which other components are provided.

Particularly preferred is an electronic device in which the substrate comprises active components, such as diodes and transistors. Such a device can be used with advantage for integrated ESD-protection, decoupling and other filtering. This application prescribes as a condition a high breakdown voltage, which is realized in that the crystallinic layer is provided by repeated application and crystallization of sub-layers. The breakdown voltage can be further improved by provision of the electrodes in an interdigitated form. It is highly preferred for this application that resistors and other capacitors are present as well. Such other capacitors may be provided with another dielectric. In such application for ESD-protection, the capacitor with the perowskite dielectric is used as a pass filter. It can be applied in the signal path, but also parallel with the diode between the signal path and ground.

The use of a dielectric with a higher dielectric constant than a lead-zirconium-titanate layer is advantageous in that it becomes applicable for storage capacitors and decoupling capacitors with large capacitance values.

The invention further relates to the electronic device obtainable with the method of manufacturing of the invention. Any secondary phases are absent in the crystalline layer in the device of the invention. This results therein that the dielectric constant is remarkably higher. Whereas the prior art mentions values of 500-550, a relative dielectric constant of more than 1500 has been found in the present invention.

These and other aspects of the invention will be further explained with reference to the figures, in which:

FIG. 1 schematically shows a cross-section of a device that can be manufactured with the method of the invention, and.

Figure 2:
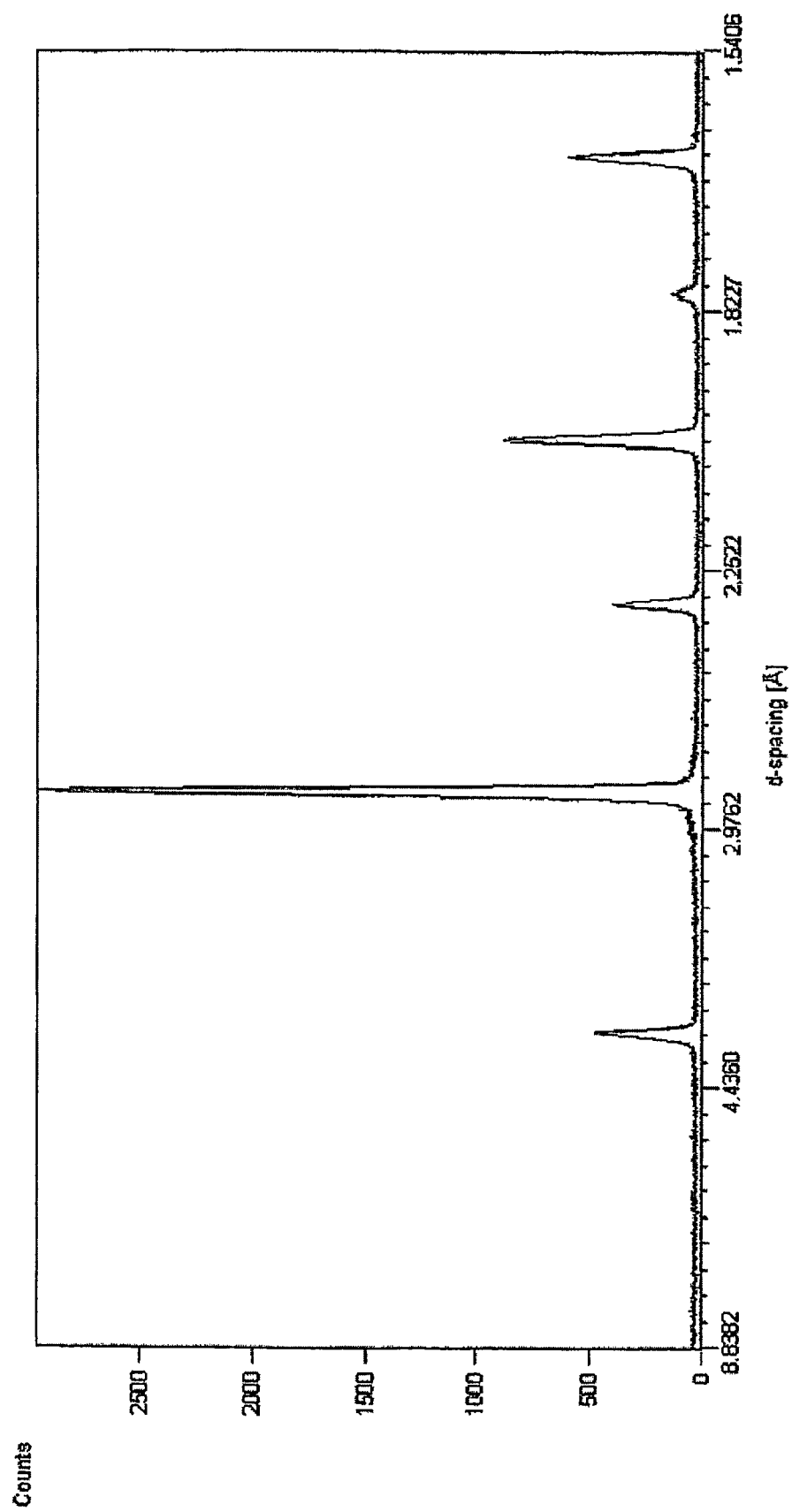

FIG. 2 shows an X-ray diffractogram of a layer obtainable with the precursor solution of the invention.

FIG. 1 shows an examplary device that can be manufactured with the method of the invention. It is not in any case meant to be limiting, and it is purely schematical. For the manufacture of an electronic component as shown in FIG. 1, a semiconducting substrate 1 was provided with first semiconductor regions 2 and second semiconductor regions 3 in the same manner as in embodiment 2. The substrate 1 was doped with B as the dopant of a first doping type. The first semiconductor regions 2 were doped with B in a higher doping density. The second semiconductor regions 3 were doped with P as the dopant of the second doping type.

An insulating layer 4 of for instance $SiO_2$, Si3N4, or a combination of SiO2 and Si3N4 is provided on the semiconductor substrate 1. On top of the insulating layer 4 a resistance layer 18, in this example of poly-Si, is provided. The insulating layer 4 and the resistance layer 18 are covered by a barrier layer 5, for instance comprising SiO2, Si3N4 or a combination of SiO2 and Si3N4 or $TiO_2$ or $Al_2O_3$ or MgO or a combination of Si3N4 and $TiO_2$. Thereon, a patterned, first electrically conductive layer 6 is provided, for instance comprising Pt with a layer thickness of 50 nm to 1 μm. Other metals may be used alternatively. Additional layers, for instance of Ti, may be present for improvement of adhesion. Electrodes of the capacitors are defined in this first conductive layer 6. A complex oxide layer 7, in this example a ferroelectric layer of $PbMg_{0.77}Nb_{0.33}O_3$ is present on the first conductive layer 6, as well as on the barrier layer 5, where the first conductive layer 6 is absent. According to the invention, a precursor solution for the ferroelectric layer comprising a chelate was provided by spincoating as a precursor, as will be explained in more detail in the embodiments. The complex oxide layer 7 was etched using wet-chemical etching. Contact holes reaching down to the semiconductor substrate 1 were made after the etching of the complex oxide layer 7, with conventional etchants that are specific for the layers. The contact holes were filled with a conductive material, such as Al, Cu, Pt or an alloy of Al and Cu or of Al and Si or combinations of Ti and Al or Ti and Cu or Ti and an alloy of Al and Cu or of Ti and Al and Si or combinations of TiW and Al or TiW and Cu or TiW and an alloy of Al and Cu or of Al and Si or combinations of TiW(N) and Al or TiW(N) and Cu or TiW(N) and an alloy of Al and Cu or Al and Si or combinations of TiN and Al or TiN and Cu or TiN an alloy of Al and Cu or of Al and Si to provide first, second and third supply leads 8,9,19. The conductive material was also provided on top of the complex oxide layer 7 to form a second electrically conductive layer 10, in which the second electrode of the capacitor is defined. Particularly in case Cu is used as the conductive material, an additional barrier layer, for instance of TaN or TiN, may be provided between the complex oxide layer 7 and the second electrically conductive layer 10. Hereon, a passivation layer 11, in this case of silicon nitride is present. The passivation layer 11 is provided with contact holes 12, 13 defining in 12, out 13 and the ground contact 15 of the circuit. Metal or solder bumps are connected to the contact in known manner.

EMBODIMENT 0.05 ml of a precursor solution comprising lead acetate, zirconium isopropoxide and titanium isopropoxide dissolved in 1-methoxy-2-propanol is spun onto a 4" (60 mm) silicon wafer, that has been provided with a thermal oxide layer and platinum electrodes on a Ti adhesion layer. A rotation speed of 2500 rpm is used. The wafer is heated on a hot plate at 150° C. and thereafter transferred to a furnace in which it is heated to 550° C. at a heating rate of 100° C./s. The wafer is kept at this temperature for 4 minutes, resulting in a perovskite seed layer of composition $Pb_{1.1}Zr0.65Ti_{0.35}O_3$ of about 50 nm thickness.

A precursor solution for lead magnesium niob oxide lead titanate (PMN PT), which was doped with lanthane, is provided as follows. A macrocyclic compound, in this case 18-Crown-6 and lead acetate, are dissolved in 1-methoxy-2-propanol in equimolar amounts under gentle heating. Niobium ethylate is dissolved in a second batch of 1-methoxy-2-propanol, therewith creating a second solution. Magnesium ethylate and titanium isopropylate are subsequently dissolved in this second solution at increased temperature. Hereafter, both solutions are cooled to room temperature and added. Then, lanthane acetylacetonate is dissolved in the solution. These steps are done in an atmosphere free of oxygen and moisture.

0.2 ml of the resulting precursor solution is spun onto the seed layer onto the wafer. A rotation speed of 2500 rpm is used. The wafer is heated on a hot plate at 350° C. and thereafter transferred to a furnace in which it is heated to 700° C. at a heating rate of 100° C./s. The wafer is kept at this temperature during 4 minutes, resulting in a complex oxide layer of about 70 nm thickness.

After repeating this process until a desired thickness is obtained, the resulting crystalline layer is ready. The crystallographic structure is perovskite, and the undesired second phase of pyrochlor is present in very small amounts. This is clear from FIG. 2. The resulting layer had a relative dielectric constant of about 1800, with a dielectric loss of 2-3% at 1 kHz and 100 mV.

FIG. 2 shows an X-ray diffractogram of the layer obtained in accordance with this embodiment. The intensity (as counts per second) is herein set out against de d-spacing (in Ångstroms). Several peaks are shown. All of them can be attributed to perovskite lead magnesium niobium oxide.

Example 1 a) 0.36 g of crown ether (18-crown-6, supplied by Merck) is dissolved in 2 mL of 1M2P. To the cold solution is added 0.44 g of $Pb(OAc)_2$, the solid dissolving after a short period of stirring. After 2 days the solution is still clear.

b) 192 μL of $Nb(OEt)_5$ are dissolved in 2 mL of 1M2P and 43 mg of $Mg(OEt)_2$ are added. The mixture is heated and stirred until the solid is almost completely dissolved. 18 μL of $Ti(O^iPr)_4$ are added. A clear yellow solution results.

c) Solutions a) and b) are mixed at room temperature and stirred. To the clear solution a small amount of lanthane acetylacetate is added. A clear solution results, which is stable for several days.

Example 2

3.58 g of 18-crown-6 are dissolved in 20 mL of 1M2P (a), 1.82 g (b), 1.74 g (c) and 1.66 g (d) of 18-crown-6 are dissolved in 10 mL of 1M2P. To the cold solutions 4.41 g (a), 2.24 g (b), 2.15 g (c) and 2.05 g (d) of $Pb(OAc)_2$ are added respectively. Initially the solid is dissolved, but slowly a fine white precipitate forms. 500 μL of demineralized water are added to each suspension, which leads to dissolving of the precipitates. Further trials show: 1. If less than 1 equivalent of crownether is used, additional water leads to dissolving. 2. Additions of either ethanol or diethylenglycolmonomethylether (1 mL) do not dissolve the precipitate.

In 10 mL of 1M2P 1.01 mL of $Nb(OEt)_5$ and subsequently in the heat 0.23 g of $Mg(OEt)_2$ is dissolved. If such a solution is added to any of the solutions a-d, very fast gelation occurs.

Example 3 a) 3.58 g of 18-crown-6 are dissolved in 20 mL of 1M2P, to the solution 4.41 g of $Pb(OAc)_2$ are added. The mixture is stirred and heated until a clear solution is obtained.

b) In 20 mL of 1M2P 1.92 mL of $Nb(OEt)_5$ are dissolved and 0.43 g of $Mg(OEt)_2$ is added. The mixture is stirred and heated until the Mg salt is dissolved. To the solution 0.18 mL of $Ti(O^iPr)_4$ is added.

I) a) is added to the hot solution b) a white oily precipitate forms, heating results in additional precipitation.

II) a) and b) are joined at room temperature, which results in a clear solution, in which 0.052 g of lanthane acetylacetate is dissolved.

Comparative Example 1 a) 5.14 g of $Pb(OAc)_2*3H_2O$ are weighed in and 10 mL of 1-methoxy-2-propanol (1M2P) are added. The slurry is heated (<100° C.) and stirred. Later another 10 mL of 1M2P are added, the solid is not dissolved. To the warm mixture approximately 1.8 mL of triethanolamine are pipetted (Pb:triethanolamine ~1:1), which results in a clear yellowish solution. On cooling a fine white precipitate forms, which redissolves on heating. To the cold suspension further 10 mL of 1M2P are added, and additionally 3 mL of Ethanol. Dissolution is still only achieved in the heat, which does not change with an addition of 20 drops of triethanolamine and a small amount of $Pb(OAc)_3*3H_2O$.

b) 0.43 g of magnesium ethoxide ($Mg(OEt)_2$) is stirred with 10 mL of 1M2P and the mixture is heated, a further 10 mL of 1M2P are added. To the suspension ~1.5 mL of triethanolamine are pipetted, which results in the formation of a fine white precipitate. Addition of 1.92 mL of niobium ethoxide ($Nb(OEt)_5$) results in a partial dissolution, therefore 3 mL of Ethanol are added. Another 20 drops of triethanolamine are added and the turbid solution is heated. After a couple of hours a clear solution is obtained, to which 0.18 mL of $Ti(O^iPr)_4$ is added. The resulting solution is clear and of yellow color.

The warm lead-containing solution and the Nb/Mg/Ti warm solution are joined and heated. The initially clear solution in the heat after 2 h becomes turbid. Renewed heating results in the formation of large amounts of a fine white dispersion.

Comparative Example 2

To 4.41 g of lead acetate (Pb(OAc)$_2$) 25 mL of Di(ethyleneglycol)methylether are added. Heating and stirring does not lead to dissolution. A total of 100 drops of triethanolamine is added successively, additionally a small amount of Pb(OAc)$_2$. The addition of triethanolamine results in dissolution of the lead compound in the heat, on cooling a fine white precipitate forms. Initially, the precipitate can be redissolved by heating, but after several cycles of cooling and heating the dissolving is incomplete.

Comparative Example 3 a) To 5.14 g of Pb(OAc)$_2$*3H$_2$O 20 mL of Butoxyethanol are added, the mixture is stirred and heated (~120° C.). To the hot suspension 50 drops of triethanolamine are added. A in the heat clear yellow solution results.

b) 1.92 mL of Nb(OEt)$_5$ are stirred with 20 mL of Butoxyethanol and 0.43 g of Mg(OEt)$_2$ is added; stirring and heating leads to a clear solution. To the solution is added 0.18 mL of Ti(O$^i$Pr)$_4$, which results in a clear yellow solution.

c) The warm solutions are joined. The resulting mixture is initially clear, but after a short period of time a fine white precipitate forms, which cannot be redissolved by addition of 50 drops of triethanolamine and heating.

Comparative Example 4

To 1.92 mL of Nb(OEt)$_5$ 30 mL of 1M2P are added. 0.43 g Mg(OEt)$_2$ is weighed to the mixture. The suspension is stirred and heated to ~120° C. for 2.5 h, after which the solid is almost completely dissolved. 0.18 mL of Ti(O$^i$Pr)$_4$ is pipetted to the solution. To the clear solution 5.14 g of Pb(OAc)$_2$*3H$_2$O are added, the suspension is stirred on the cooling hot plate. The solid is not dissolved, therefore the mixture is heated again and a total of 10 mL ethanol is added. As no dissolution results the mixture is refluxed at 140-150° C. under N$_2$ to no visual effect. The remaining solid is very fine grained. No gelation occurs on addition of denaturated ethanol.

Comparative Example 5

2.69 mL of 15-crown-5 are dissolved in 20 mL of 1M2P and 4.41 g of Pb(OAc)$_2$ are added to the solution. Even in the heat (~100° C.) the lead compound does not dissolve. More crownether, to a total of 5 mL (including the initial amount), is added. The molar ratio of crownether and Pb$^{2+}$ in the resulting mixture approximates 2:1. Heating and prolonged (>1d) stirring does not lead to the dissolving of the lead compound.

The invention claimed is:

1. A method of preparing a precursor solution for a crystalline layer comprising an oxide of lead, niobium and a third metal, comprising the steps of:
   providing a first solution of a lead salt that is chelated with a macrocyclic compound having a cavity corresponding to the size of the lead-ion, in a solvent chosen from the group of alkoxyalcohols;
   providing a second solution comprising niobium in the form of alcoholates; and
   mixing the first and the second solution.

2. A method as claimed in claim 1, characterized in that the lead salt is chosen such that on mixing the first and the second solution at least one ester will be formed.

3. A method as claimed in claim 1, characterized in that the third metal is magnesium, which is present in the second solution.

4. A method as claimed in claim 2, characterized in that the lead salt is chosen from the group of carboxylates and nitrates.

5. A method as claimed in claim 1, characterized in that the macrocyclic compound is a 18-crown-6 ether.

6. A precursor solution for a crystalline layer comprising an oxide of lead, niobium and a third metal obtainable by the method of claim 1.

7. A method of manufacturing an electronic device comprising the step of applying a precursor solution for a crystalline layer comprising an oxide of lead, niobium and a third metal onto a substrate, and crystallizing it to said layer, characterized in that the precursor solution according to claim 6 is used.

8. A method according to claim 7, characterized in that:
   the substrate surface onto which the precursor solution is applied, is provided with a first electrode;
   the said layer is structured according to a desired pattern and on top of the said layer a second electrode is provided.

9. A method as claimed in claim 7, wherein the substrate is a semiconductor substrate in which a first active component is defined.

10. A method as claimed in claim 9, wherein the active component, the capacitor and at least one resistor are mutually interconnected so as to provide a combined ESD-protection and decoupling function.

11. A method of preparing a precursor solution for a crystalline layer comprising an oxide of lead, niobium and a third metal, comprising the steps of:
   providing a first solution of a lead salt that is chelated with a macrocyclic compound having a cavity corresponding to the size of the lead-ion, in a solvent chosen from the group of alkoxyalcohols;
   providing a second solution comprising niobium in the form of alcoholates; and
   mixing the first and the second solution;
   wherein the precursor solution is obtainable by providing the first solution, providing the second solution, and mixing the first and second solutions;
   manufacturing an electronic device comprising the step of applying the precursor solution for a crystalline layer comprising an oxide of lead, niobium and a third metal onto a substrate, and crystallizing it to said layer;
   wherein the substrate is a semiconductor substrate in which a first active component is defined; and
   wherein the active component, the capacitor and at least one resistor are mutually interconnected so as to provide a combined LSD-protection and decoupling function.

12. A method as claimed in claim 11, characterized in that the lead salt is chosen such that on mixing the first and the second solution at least one ester will be formed.

13. A method as claimed in claim 11, characterized in that the third metal is magnesium, which is present in the second solution.

14. A method as claimed in claim 12, characterized in that the lead salt is chosen from the group of carboxylates and nitrates.

15. A method as claimed in claim 11, characterized in that the macrocyclic compound is a 18-crown-6 ether.

16. A method according to claim 11, characterized in that:
   the substrate surface onto which the precursor solution is applied, is provided with a first electrode;

the said layer is structured according to a desired pattern and on top of the said layer a second electrode is provided.

17. A method of manufacturing an electronic device comprising the step of:
applying a precursor solution for a crystalline layer comprising an oxide of lead, niobium and a third metal onto a substrate, and crystallizing it to said layer, characterized in that the precursor solution is prepared by:
providing a first solution of a lead salt that is chelated with a macrocyclic compound having a cavity corresponding to the size of the lead-ion, in a solvent chosen from the group of alkoxyalcohols;
providing a second solution comprising niobium in the form of alcoholates; and
mixing the first and the second solution;
wherein the substrate is a semiconductor substrate in which a first active component is defined; and
wherein the active component, the capacitor and at least one resistor are mutually interconnected so as to provide a combined ESD-protection and decoupling function.

18. A method according to claim 17, characterized in that:
the substrate surface onto which the precursor solution is applied, is provided with a first electrode;
the said layer is structured according to a desired pattern and on top of the said layer a second electrode is provided.

* * * * *